(12) United States Patent
Hosono

(10) Patent No.: US 10,354,672 B2
(45) Date of Patent: Jul. 16, 2019

(54) DETERMINATION DEVICE, DETERMINATION METHOD THAT DETERMINES PROCESS RELATED TO REPRODUCTION OF SPEECH SIGNAL

(71) Applicant: JVC KENWOOD Corporation, Yokohama-shi, Kanagawa (JP)

(72) Inventor: Eiiti Hosono, Yokohama (JP)

(73) Assignee: JVC KENWOOD Corporation, Yokohama-shi (JP)

( * ) Notice: Subject to any disclaimer, the term of this patent is extended or adjusted under 35 U.S.C. 154(b) by 0 days.

(21) Appl. No.: 15/879,635

(22) Filed: Jan. 25, 2018

(65) Prior Publication Data

US 2018/0254052 A1 Sep. 6, 2018

(30) Foreign Application Priority Data

Mar. 3, 2017 (JP) ................. 2017-040108

(51) Int. Cl.
*G06F 3/16* (2006.01)
*G10L 21/0208* (2013.01)
*H04M 3/42* (2006.01)
*H04W 76/10* (2018.01)
*H03G 3/32* (2006.01)

(52) U.S. Cl.
CPC ..... *G10L 21/0208* (2013.01); *H04M 3/42212* (2013.01); *H04W 76/10* (2018.02); *G10L 2021/02087* (2013.01); *H03G 3/32* (2013.01); *H04M 2203/2044* (2013.01); *H04M 2203/2094* (2013.01); *Y02D 70/00* (2018.01); *Y02D 70/164* (2018.01)

(58) Field of Classification Search
CPC .......... G10L 15/20; G10L 15/24; G10L 25/78
USPC .................................. 704/200, 246
See application file for complete search history.

(56) References Cited

U.S. PATENT DOCUMENTS

| | | | | |
|---|---|---|---|---|
| 8,805,404 B1 * | 8/2014 | Yang | ....... | H04W 4/02 455/456.1 |
| 2007/0133818 A1 * | 6/2007 | Griffin | ....... | H04B 15/02 381/94.1 |
| 2009/0257369 A1 * | 10/2009 | Igarashi | ....... | H04W 52/0261 370/311 |
| 2015/0279356 A1 * | 10/2015 | Lee | ....... | G10L 15/24 704/251 |

FOREIGN PATENT DOCUMENTS

JP 2007-096838 A 4/2007

\* cited by examiner

*Primary Examiner* — George C Monikang
(74) *Attorney, Agent, or Firm* — Brundidge & Stanger, P.C.

(57) ABSTRACT

An input unit receives a request for transmission of a speech signal to a predetermined group. When the request for transmission is received in the input unit, a determination unit determines a process related to reproduction of the speech signal in a terminal device expected to receive a speech, based on a distance between terminal devices expected to receive the speech signal, excluding the terminal device outputting the request from a plurality of terminal devices belonging to the predetermined group. An output unit outputs the detail determined in the determination unit.

6 Claims, 13 Drawing Sheets

10

200

| UID | POSITION INFORMATION |
|---|---|
| 1 | POSITION INFORMATION 1 |
| 2 | POSITION INFORMATION 2 |
| 3 | POSITION INFORMATION 3 |
| 4 | POSITION INFORMATION 4 |
| 5 | POSITION INFORMATION 5 |
| 6 | POSITION INFORMATION 6 |
| 7 | POSITION INFORMATION 7 |

| GID | UID |
|-----|-----|
| 1 | 1 |
| 1 | 2 |
| 1 | 3 |
| 1 | 4 |
| 1 | 5 |
| 2 | 6 |
| 2 | 7 |

| UID | POSITION INFORMATION | SOUND VOLUME SETTING INFORMATION |
|---|---|---|
| 1 | POSITION INFORMATION 1 | 30 |
| 2 | POSITION INFORMATION 2 | 28 |
| 3 | POSITION INFORMATION 3 | 15 |
| 4 | POSITION INFORMATION 4 | 40 |
| 5 | POSITION INFORMATION 5 | 46 |
| 6 | POSITION INFORMATION 6 | 28 |
| 7 | POSITION INFORMATION 7 | 32 |

| UID | POSITION INFORMATION | REPRODUCTION METHOD INFORMATION |
|---|---|---|
| 1 | POSITION INFORMATION 1 | HEADSET |
| 2 | POSITION INFORMATION 2 | SPEAKER |
| 3 | POSITION INFORMATION 3 | SPEAKER |
| 4 | POSITION INFORMATION 4 | SPEAKER |
| 5 | POSITION INFORMATION 5 | SPEAKER |
| 6 | POSITION INFORMATION 6 | HEADSET |
| 7 | POSITION INFORMATION 7 | SPEAKER |

| UID | POSITION INFORMATION | ENVIRONMENTAL SOUND VOLUME INFORMATION |
|---|---|---|
| 1 | POSITION INFORMATION 1 | 24 |
| 2 | POSITION INFORMATION 2 | 26 |
| 3 | POSITION INFORMATION 3 | 28 |
| 4 | POSITION INFORMATION 4 | 12 |
| 5 | POSITION INFORMATION 5 | 14 |
| 6 | POSITION INFORMATION 6 | 32 |
| 7 | POSITION INFORMATION 7 | 40 |

| UID | POSITION INFORMATION | MINIMUM AUDIBLE LEVEL |
|---|---|---|
| 1 | POSITION INFORMATION 1 | 20 |
| 2 | POSITION INFORMATION 2 | 0 |
| 3 | POSITION INFORMATION 3 | 0 |
| 4 | POSITION INFORMATION 4 | 0 |
| 5 | POSITION INFORMATION 5 | 0 |
| 6 | POSITION INFORMATION 6 | 30 |
| 7 | POSITION INFORMATION 7 | 0 |

| TRANSMISSION SOURCE UID | PROCESSING METHOD |
|---|---|
| 3 | INCREASE BY 30 |
| 5 | NO CHANGE |

| SPEECH INFORMATION |
|---|

206

DETERMINATION DEVICE, DETERMINATION METHOD THAT DETERMINES PROCESS RELATED TO REPRODUCTION OF SPEECH SIGNAL

CROSS-REFERENCE TO RELATED APPLICATION

This application is based upon and claims the benefit of priority from the prior Japanese Patent Application No. 2017-040108, filed on Mar. 3, 2017, the entire contents of which are incorporated herein by reference.

BACKGROUND

1. Field

The present invention relates to communication technology and, more particularly, to a determination device and determination method for determining a process related to reproduction of a speech signal.

2. Description of the Related Art

For the purpose of realizing smooth group calls, a terminal device to connect to is selected from terminal devices belonging to the same group, by measuring a distance between a caller and a receiver by using at least position information. This inhibits reception in a terminal device in the neighborhood of the caller and promotes clarity of the call (see, for example, patent document 1).

[patent document 1] JP2007-96838

In the related art document, the distance between the caller and the receiver is considered but the distance between receivers is not considered. When a plurality of terminal devices located in the neighborhood of each other reproduce the same speech, it would be difficult to hear the speech clearly due to the speech heard around. When a delay that differs from one terminal device to another occurs while the speech is reproduced, it would be further difficult to hear the speech. Further, since all of the terminal devices belonging to the same group reproduce the speech, electric power is consumed in all of the terminal devices.

SUMMARY

To address the aforementioned issue, a determination device according to an embodiment comprises: an input unit that receives a request for transmission of a speech signal to a predetermined group; and a determination unit that determines a process related to reproduction of the speech signal in a terminal device expected to receive a speech, based on a distance between terminal devices expected to receive the speech signal, excluding the terminal device outputting the request from a plurality of terminal devices belonging to the predetermined group.

Another embodiment also relates to a determination device. The device comprises: an input unit that receives a request for transmission of a speech signal to a predetermined group; and a determination unit that determines a process related to reproduction of the speech signal in a terminal device expected to receive a speech, based on a distance between the terminal device expected to receive the speech signal and a user using the terminal device expected to receive the speech signal, excluding the terminal device outputting the request from a plurality of terminal devices belonging to the predetermined group.

Still another embodiment relates to a determination method. The method comprises: receiving a request for transmission of a speech signal to a predetermined group; and determining a process related to reproduction of the speech signal in a terminal device expected to receive a speech, based on a distance between terminal devices expected to receive the speech signal, excluding the terminal device outputting the request from a plurality of terminal devices belonging to the predetermined group.

Still another embodiment relates to a determination method. The method comprises: receiving a request for transmission of a speech signal to a predetermined group; and determining a process related to reproduction of the speech signal in a terminal device expected to receive a speech, based on a distance between the terminal device expected to receive the speech signal and a user using the terminal device expected to receive the speech signal, excluding the terminal device outputting the request from a plurality of terminal devices belonging to the predetermined group.

Optional combinations of the aforementioned constituting elements, and implementations of the embodiments in the form of methods, apparatuses, systems, recording mediums, and computer programs may also be practiced as additional modes of the embodiments.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which:

FIG. 6 shows a data structure of another database stored in the storage unit of FIG. 4;

FIG. 12 shows a data structure of a database stored in the storage unit according to variation 1;

FIG. 13 shows a data structure of a database stored in the storage unit according to variation 2;

FIG. 14 shows a data structure of a database stored in the storage unit according to variation 3;

FIG. 15 shows a data structure of a database stored in the storage unit according to variation 4;

FIG. 16 shows a data structure of the specified transmission destination and process call generated in the call controller according to embodiment 2.

DETAILED DESCRIPTION

The invention will now be described by reference to the preferred embodiments. This does not intend to limit the scope of the present invention, but to exemplify the invention.

Embodiment 1

A summary will be given before describing the invention in specific details. Embodiment 1 relates to a communication system in which group calls are made in a group including a plurality of terminal devices. Group calls are made by using a Push to Talk (PTT) service. In PTT, the user pushes a button to start a conversation and releases the button when the conversation is terminated. One of the terminal devices in a group transmits a speech signal and the other terminal devices in the group receive speech data. Therefore, all of the terminal devices reproduce a speech even when users carrying the plurality of terminal devices belonging to the same group are located at distances where the users can hear the speech reproduced by the terminal devices sufficiently. This makes the same speech heard from a plurality of locations and makes it difficult for users to catch the speech. When a speech reproduction delay inherent to terminal devices occurs, reproduction of the speech is timed differently in those devices so that users find it even more difficult to catch the speech. Because all of the terminal devices belonging to the same group reproduce the speech, electric power is consumed in all of the terminal devices. To address this, the embodiment selects a recipient terminal device to which the speech signal should be transmitted, based on the distance between the terminal devices expected to receive the speech.

Figure 1:
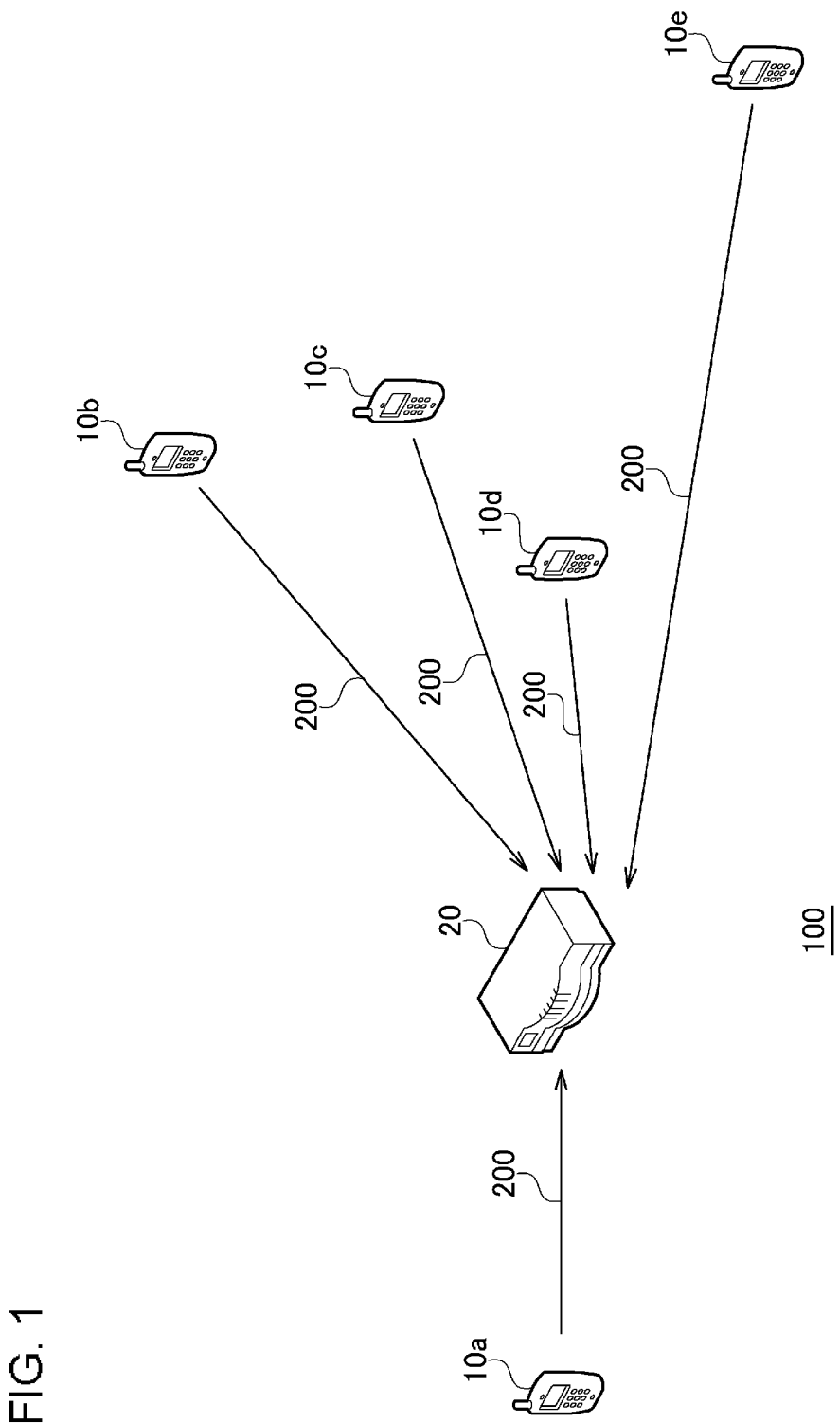
FIG. 1 shows a configuration of a communication system according to embodiment 1.

FIG. 1 shows a configuration of a communication system 100. The communication system 100 includes a first terminal device 10a, a second terminal device 10b, a third terminal device 10c, a fourth terminal device 10d, a fifth terminal device 10e, which are generically referred to as terminal devices 10, and a call controller 20. The number of terminal devices 10 is not limited to "5". The communication system 100 includes a base station device (not shown). The base station device performs wireless communication with the terminal devices 10 and performs wired communication with the call controller 20. Therefore, the base station device relays communication between the terminal devices 10 and the call controller 20. An example of the communication system 100 like this is a business wireless system.

Identification information (hereinafter, also referred to as "UID") identifying the terminal device 10 is assigned to each terminal device 10. For example, the UID of the first terminal device 10a is "1", the UID of the second terminal device 10b is "2", and the UID of the third terminal device 10c is "3". Further, a plurality of terminal devices 10 form a group. Identification information (hereinafter, referred to as "GID") identifying a group is assigned to each group. For example, "GID=1" is set for the first terminal device 10a through the fifth terminal device 10e. Each terminal device 10 acquires position information and transmits a position notification 200 including the position information to the call controller 20. The process is performed periodically. The call controller 20 receives the position notification 200 from the terminal devices 10 and manages the position information of the terminal devices 10.

Figure 2:
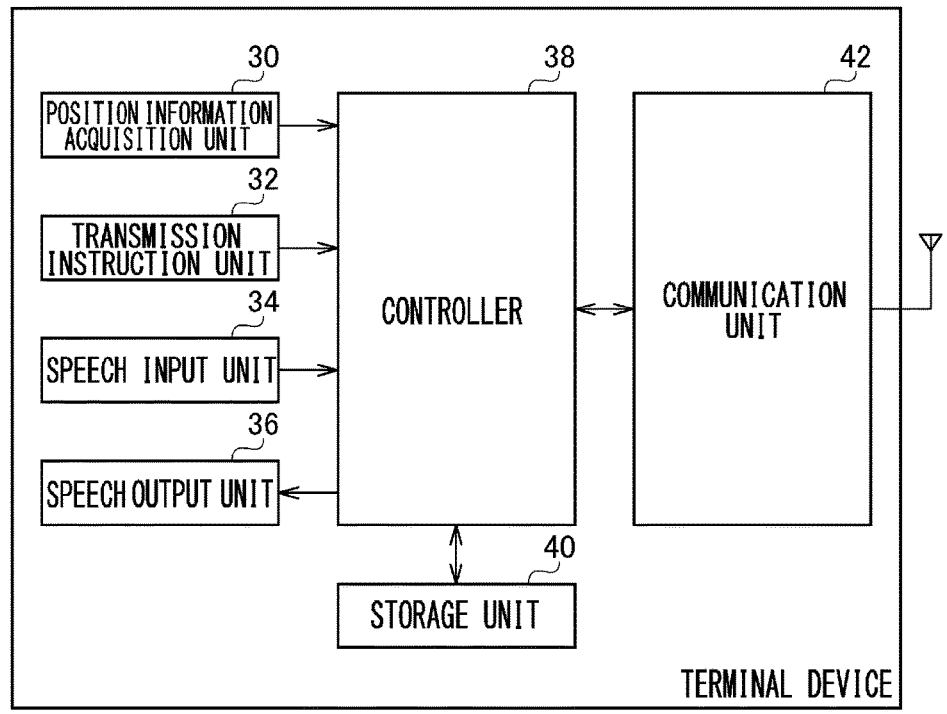
FIG. 2 shows a configuration of the terminal device of FIG. 1.

FIG. 2 shows a configuration of the terminal device 10. The terminal device 10 includes a position information acquisition unit 30, a transmission instruction unit 32, a speech input unit 34, a speech output unit 36, a controller 38, a storage unit 40, and a communication unit 42. The storage unit 40 stores the UID and GID for identifying the terminal device 10. The position information acquisition unit 30 is comprised of, for example, a Global Positioning System (GPS) wave receiver and acquires current position information of the terminal device 10. For example, the position information is comprised of latitude and longitude.

Figure 3:
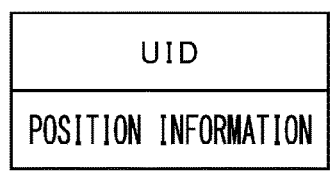
FIG. 3 shows a data structure of the position notification generated in the terminal device of FIG. 2.

The controller 38 generates the position notification 200 when necessary (e.g., every 10 seconds). FIG. 3 shows a data structure of the position notification 200 generated in the terminal device 10. The position information acquired by the position information acquisition unit 30 and the UID stored in the storage unit 40 are set in the position notification 200. Reference is made back to FIG. 2. The communication unit 42 transmits the position notification 200 generated in the controller 38 to the call controller 20. The other constituting elements in FIG. 2 will be discussed later.

The features are implemented in hardware such as a CPU, a memory, or other LSI's, of a computer and in software such as a program loaded into a memory. The figure depicts functional blocks implemented by the cooperation of these elements. Therefore, it will be obvious to those skilled in the art that the functional blocks may be implemented in a variety of manners by hardware only, by software only, or by a combination of hardware and software.

Figures 4, 5:
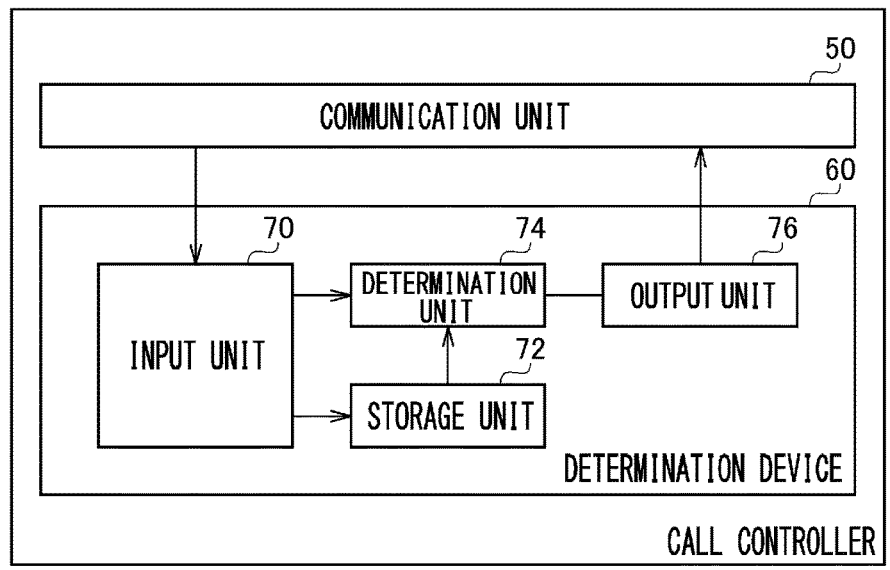
FIG. 4 shows a configuration of the call controller of FIG. 1.
FIG. 5 shows a data structure of a database stored in the storage unit of FIG. 4.

FIG. 4 shows a configuration of the call controller 20. The call controller 20 includes a communication unit 50 and a determination device 60. The determination device 60 includes an input unit 70, a storage unit 72, a determination unit 74, and an output unit 76. The communication unit 50 communicates with the terminal device 10 via the base station device. The input unit 70 receives the position notification 200 from each terminal device 10 via the communication unit 50 when necessary (e.g., every 10 seconds). The input unit 70 outputs the position notification 200 to the storage unit 72.

Figure 6:
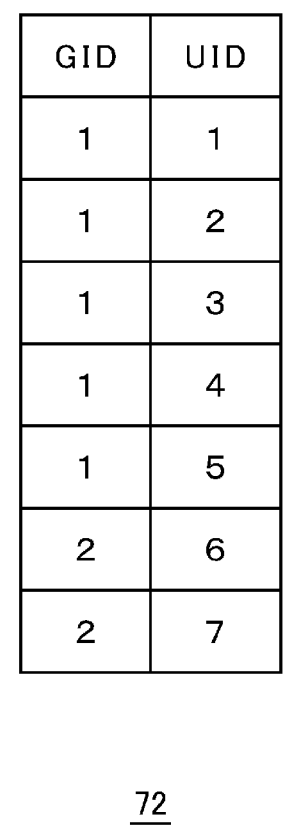

The storage unit 72 stores a database. FIG. 5 shows a data structure of a database stored in the storage unit 72. The UIDs of the terminal devices 10 and the position information are mapped to each other in the database (hereinafter, referred to as "position database"). The position database is created based on the position notification 200 received from the input unit 70. FIG. 6 shows a data structure of a further database stored in the storage unit 72. In the further database (hereinafter, referred to as "GID database"), the GIDs of the groups and the UIDs of the terminal devices 10 belonging to the groups are mapped to each other. The other constituting elements in FIG. 4 will be described later.

Figure 7:
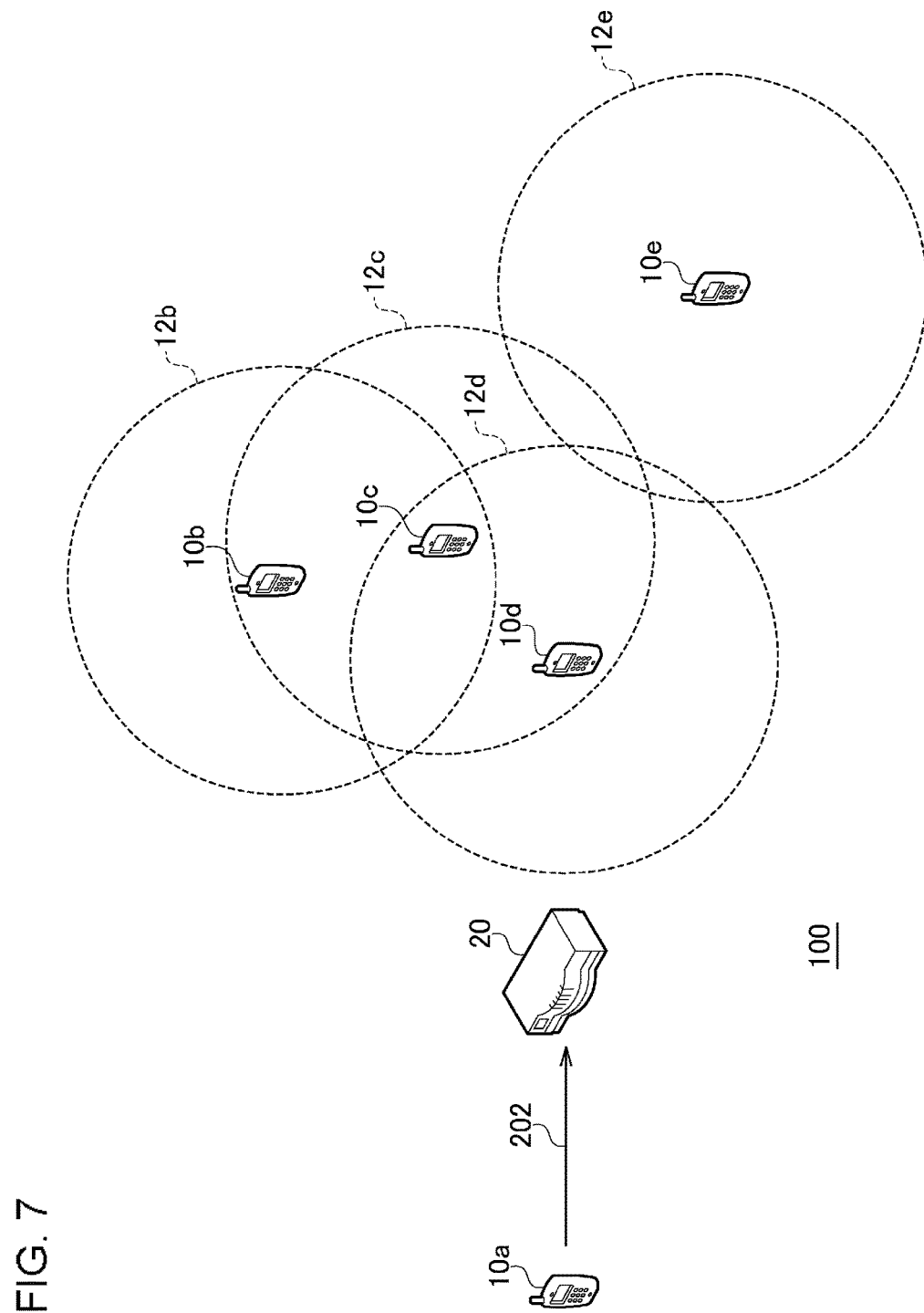
FIG. 7 shows a configuration of the communication system relevant to the process that follows the process in FIG. 1.

FIG. 7 shows a configuration of the communication system 100 relevant to the process that follows the process in FIG. 1. The first terminal device 10a represents the terminal device 10 at the transmitting end, and the other terminal devices 10 represent the terminal devices expected to receive the speech. The terminal device 10 transmits a group call transmission request 202 to the call controller 20 to initiate a group call. Referring to FIG. 2, the transmission instruction unit 32 of the terminal device 10 is comprised of, for example, a PTT button, which is switched into a pressed state or a released state (non-pressed state) according to the user operation. The speech input unit 34 is comprised of, for example, a microphone. The speech input unit 34 collects a speech of the user and converts the speech into an electrical signal.

Figure 8:
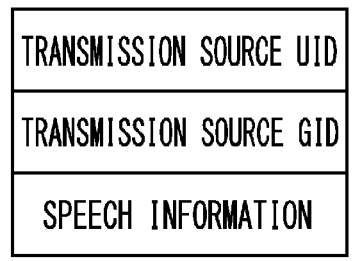
FIG. 8 shows a data structure of the group call transmission request generated in the terminal device of FIG. 2.

The controller 38 detects the pressed state of the transmission instruction unit 32 and, while the pressed state is being detected, generates the group call transmission request 202. FIG. 8 shows a data structure of the group call transmission request 202 generated in the terminal device 10. The UID stored in the storage unit 40 is set in the transmission source UID of the group call transmission request 202. The GID stored in the storage unit 40 is set in the transmission source GID of the group call transmission request 202. Information of the electrical signal produced by conversion in the speech input unit 34 is set in the speech information in the group call transmission request 202. Reference is made back to FIG. 2. The communication unit 42 transmits the group call transmission request 202 generated in the controller 38 to the call controller 20.

The input unit 70 of the call controller 20 of FIG. 4 receives the group call transmission request 202 from the terminal device 10 (e.g., the first terminal device 10a) via the communication unit 50. The group call transmission request 202 can be said to be a request to transmit a speech signal to a predetermined group. When the input unit 70 receives the group call transmission request 202, the determination unit 74 performs the subsequent process.

(1) The determination unit 74 receives the group call transmission request 202 from the input unit 70.

(2) The determination unit 74 refers to the GUI database stored in the storage unit 72 and identifies the UIDs of the terminal devices 10 belonging to the group of the transmission destination GID in the input group call transmission request 202. Given that the transmission destination GID of the group call transmission request 202 is 1, for example, 1, 2, 3, 4, 5 are identified as the UIDs.

(3) When the transmission source UID of the group call transmission request 202 is included in the UIDs identified in (2) above, the determination unit 74 excludes the UID from the identified UIDs. Given that the transmission source ID of the group call transmission request 202 is 1, the identified UIDs will be 2, 3, 4, 5.

(4) The determination unit 74 identifies all subgroups that can be formed, based on the UIDs identified in (3) above. In the aforementioned example, a total of 15 subgroups including (a) 2, 3, 4, (b) 2, 3, 5, (c) 2, 4, 5, (d) 3, 4, 5, (e) 2, 3, (f) 2, 4, (g) 3, 4, (h) 2, 5, (i) 3, 5, (j) 4, 5, (k) 2, (l) 3, (m) 4, and (n) 5.

(5) The determination unit 74 subjects each subgroup identified in (4) above to the following determination.

(5-1) The determination unit 74 identifies UIDs that are identified in (3) above and that are not included in each subgroup identified in (4) above. In the case of the subgroup "(i) 3, 5", for example, the UIDs 2, 4 are identified.

(5-2) The determination unit 74 refers to the position database and determines whether the position indicated by the position information corresponding to the respective UIDs identified in (5-1) above is within a threshold value from any of the position information corresponding to the UIDs included in the relevant subgroup. For example, the threshold value is 3 m. The threshold value is shown in FIG. 7 as a second determination range 12b for the second terminal device 10b. The third determination range 12c through the fifth determination range 12e are similar. For example, a determination is made as to whether the position information 2 is within the predetermined distance of 3 m from the position information 3 or the position information 5. Further, a determination is made as to whether the position information 4 is within the predetermined distance of 3 m from the position information 3 or the position information 5.

(5-3) The determination unit 74 identifies a subgroup for which all determinations made in (5-2) have found that the position information is within the threshold value. For example, the subgroup "(i) 3, 5" is identified.

(6) The determination unit 74 identifies the UIDs included in the subgroup identified in (5-3) as the transmission destination UIDs. For example, the determination unit 74 determines the transmission destination UIDs to be 3, 5. When a plurality of subgroups are identified in (5-3), the determination unit 74 identifies one subgroup based on a predetermined condition (e.g., a subgroup including fewer UIDs) and determines the transmission destination UIDs accordingly. The terminal device 10 may transmit the battery level to the call controller 20 periodically, the storage unit 72 may store the battery level of the terminal devices 10, and the determination unit 74 may determine the recipient terminal device 10 based on the battery level of the terminal devices 10 expected to receive the speech. In this process, it is ensured that the terminal device 10 with a low battery level is not selected.

In other words, the determination unit 74 determines the recipient terminal device 10 that should receive the speech signal, based on the distances between the terminal devices 10 expected to receive the speech, excluding the terminal device 10 outputting the transmission request from the plurality of terminal devices 10 belonging to the predetermined group. Determining the recipient terminal device 10 that should receive the speech signal represents determining a process related to the reproduction of the speech signal in the terminal device 10 expected to receive the speech. For determination of the recipient terminal device 10 that should receive the speech signal, a result of comparison between the distance between the terminal devices 10 expected to receive the speech and the threshold value is used. According to the aforementioned example, the distances between the terminal devices excluding the terminal device 10 outputting the transmission request are indicated as the distance between the position information 2 and the position information 3, the distance between the position information 2 and the position information 4, the distance between the position information 2 and the position information 5, the distance between the position information 3 and the position information 4, the distance between the position information 3 and the position information 5, and the distance between the position information 4 and the position information 5.

Figure 9:
FIG. 9 shows a data structure of the specified transmission destination call generated in the call controller of FIG. 4.

(7) The determination unit 74 generates a specified transmission destination call 204. FIG. 9 shows a data structure of the specified transmission destination call 204 generated in the call controller 20. The specified transmission destination call 204 is comprised of the transmission destination UID identifying one or a plurality of transmission destination terminal devices 10 and speech information. The determination unit 74 sets the transmission destination UIDs determined in (6) above in the transmission destination UIDs of the specified transmission destination call 204. For example, 3 and 5 are set. Further, the determination unit 74 sets the input speech information in the speech information of the specified transmission destination call 204. Reference is made back to FIG. 4. The output unit 76 outputs the specified transmission destination call 204 determined in the determination unit 74 to the communication unit 50, and the communication unit 50 transmits the specified transmission destination call 204 via the base station device. For example, the communication unit 50 broadcasts the specified transmission destination call 204.

Figure 10:
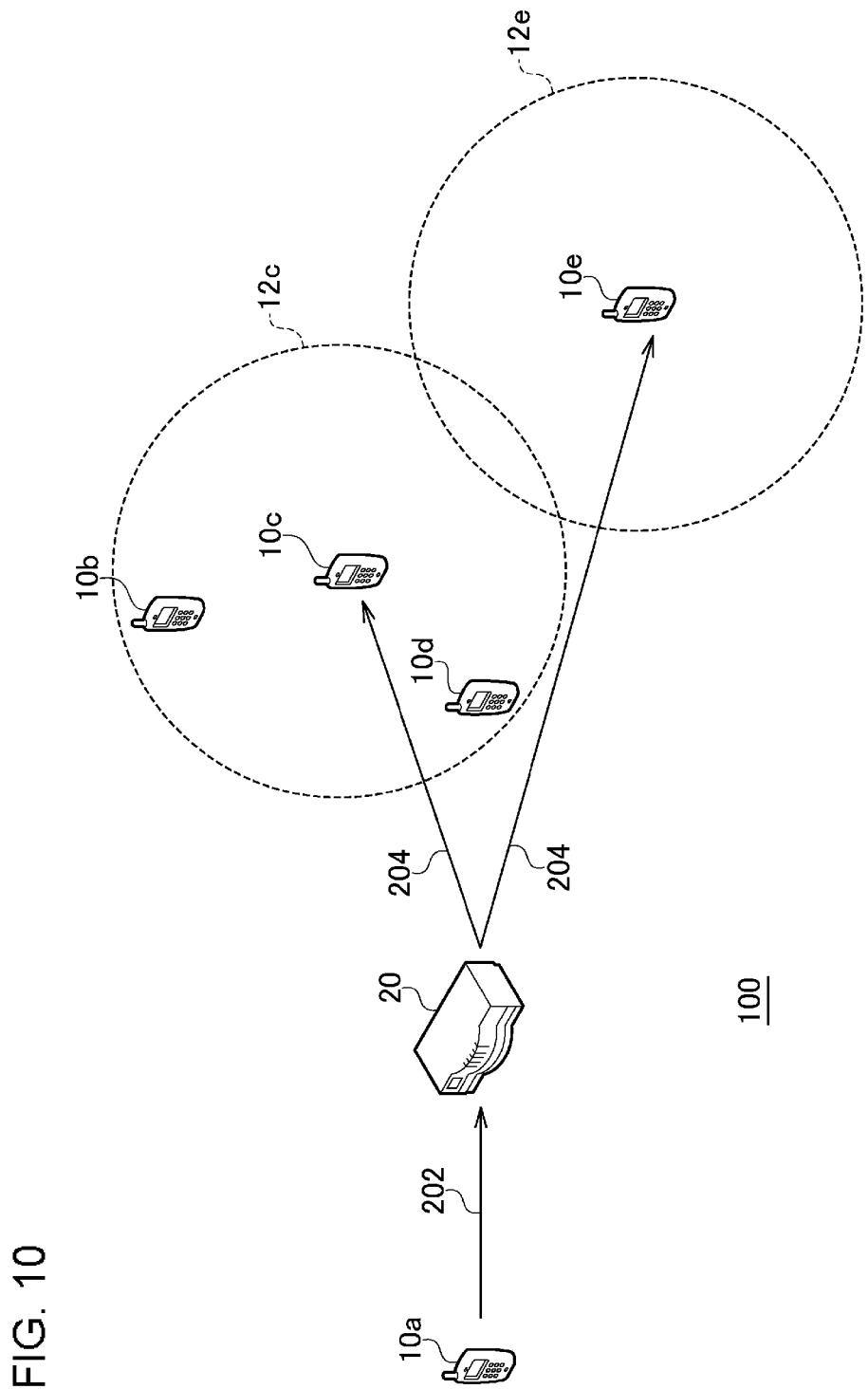
FIG. 10 shows a configuration of the communication system relevant to the process that follows the process in FIG. 7.

FIG. 10 shows a configuration of the communication system 100 relevant to the process that follows the process in FIG. 7. As described above, the call controller 20 broadcasts the specified transmission destination call 204 destined to the third terminal device 10c and the fifth terminal device 10e. The communication unit 42 of the terminal device 10 of FIG. 2 receives the specified transmission destination call 204 from the call controller 20. The controller 38 receives an input of the transmission destination UIDs of the specified transmission destination call 204 received in the communication unit 42. The controller 38 determines whether any one of the UIDs set in the transmission UIDs matches the UID stored in the storage unit 40. If a match is found, the controller 38 receives an input of the speech information of the specified transmission destination call 204. If a match does not occur, the controller 38 does not receive an input of the speech information of the specified transmission destination call 204. For example, the speech output unit 36 is comprised of a speaker. When the controller 38 receives an input of the speech information, the speech output unit 36 reproduces a speech based on that speech information.

Figure 11:
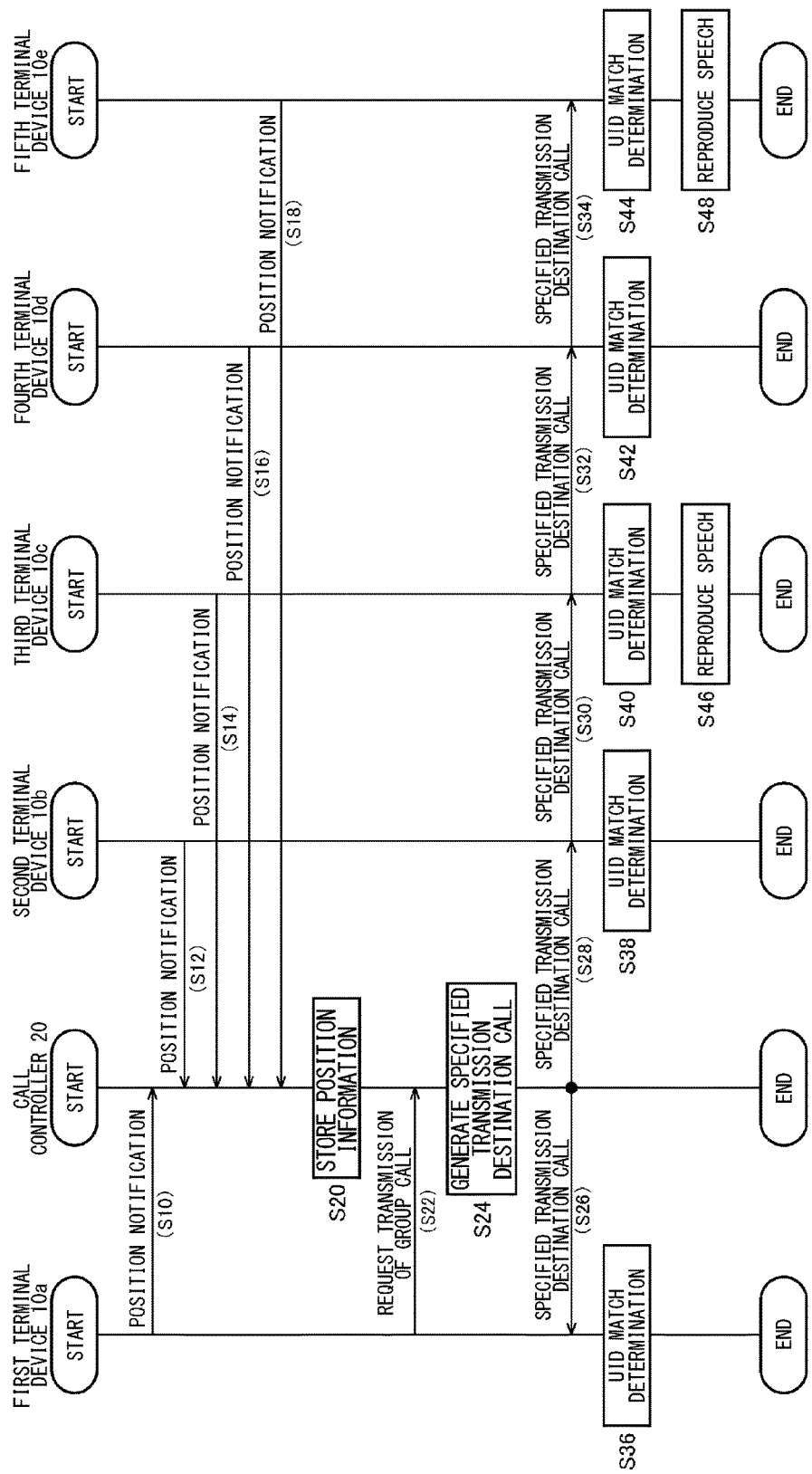
FIG. 11 is a sequence chart showing a communication procedure in the communication system according to embodiment 1.

A description will now be given of the operation of the communication system 100 with the above configuration. FIG. 11 is a sequence chart showing a communication procedure in the communication system 100. The first terminal device 10a through the fifth terminal device 10e transmit the position notification 200 to the call controller 20 (S10-S18). The call controller 20 stores the position information (S20). The first terminal device 10a transmits the group call transmission request 202 to the call controller 20 (S22). The call controller 20 generates the specified transmission destination call 204 (S24). The call controller 20 broadcasts the specified transmission destination call 204 to the first terminal device 10a through the fifth terminal device 10e (S26~S34). The first terminal device 10a through the fifth terminal device 10e make a determination to see whether the UIDs match (S36~S44). The third terminal device 10c reproduces the speech (S46), and the fifth terminal device 10e reproduces the speech (S48).

The determination unit 74 as described so far determines the recipient terminal device 10 that should receive the speech signal by comparing the distance between the terminal devices 10 expected to receive the speech with the threshold value. In this process, the threshold value is defined to be a fixed value. The threshold value may be variable in order to adjust the recipient terminal device 10 that should be determined. In the following, variations directed to configuring the threshold value to be variable will be described.

(Variation 1)

Referring to FIG. 2, the controller 38 of each terminal device 10 acquires information set in the speech output unit 36 and related to the sound volume of reproduced speech signal (hereinafter, referred to as "sound volume setting information"). Further, the controller 38 transmits the sound volume setting information to the call controller 20 via the communication unit 42. Referring to FIG. 4, the communication unit 50 of the call controller 20 receives the sound volume setting information from each terminal device 10. The storage unit 72 receives the sound volume setting information from each terminal device 10 via the input unit 70 and stores the received information. FIG. 12 shows a data structure of a database stored in the storage unit 72. The sound volume setting information is added to the position database. For example, the larger the value of the sound volume setting information, the larger the reproduced sound volume. Reference is made back to FIG. 4. In (5-2) above, the determination unit 74 changes the threshold value in accordance with the sound volume of reproduced speech signal set in the terminal device 10 of the UID included in the subgroup. For example, it is ensured that the larger the reproduced sound volume, the larger the threshold value.

(Variation 2)

Referring to FIG. 2, the controller 38 of each terminal device 10 acquires information set in the speech output unit 36 and related to a method of reproducing the speech signal (hereinafter, referred to as "reproduction method information"). The method of reproducing the speech signal is, for example, "headset" or "speaker". Further, the controller 38 transmits the reproduction method information to the call controller 20 via the communication unit 42. Referring to FIG. 4, the communication unit 50 of the call controller 20 receives the reproduction method information from each terminal device 10. The storage unit 72 receives the reproduction method information from each terminal device 10 via the input unit 70 and stores the received information. FIG. 13 shows a data structure of a database stored in the storage unit 72. The reproduction method information is added to the position database. For example, the headset or the speaker is indicated. Reference is made back to FIG. 4. In (5-2) above, the determination unit 74 changes the threshold value in accordance with the method of reproducing the speech signal set in the terminal device 10 of the UID included in the subgroup. For example, the threshold value is set to 3 m in the case of the speaker and to 0 m in the case of the headset.

(Variation 3)

Referring to FIG. 2, the controller 38 of each terminal device 10 acquires environmental sound around the terminal device 10 via the speech input unit 34. Further, the controller 38 generates information related to environmental sound volume (hereinafter, referred to as "environmental sound volume information") based on the sound volume of the environmental sound. Further, the controller 38 transmits the environmental sound volume information to the call controller 20 via the communication unit 42. Referring to FIG. 4, the communication unit 50 of the call controller 20 receives the environmental sound volume information from each terminal devices 10. The storage unit 72 receives the environmental sound volume information from each terminal devices 10 via the input unit 70 and stores the received information. FIG. 14 shows a data structure of a database stored in the storage unit 72. The environmental sound volume information is added to the position database. For example, the larger the value of the environmental sound volume information, the larger the environmental sound volume. A situation with a large environmental sound volume represents a situation with a large noise. Reference is made back to FIG. 4. In (5-2) above, the determination unit 74 changes the threshold value in accordance with the environmental sound volume around the terminal device 10 expected to receive the speech. For example, it is ensured that the larger the environmental sound volume, the smaller the threshold value.

(Variation 4)

Referring to FIG. 4, the storage unit 72 of the call controller 20 stores aural characteristic information on the user using the terminal device 10 expected to receive the speech. FIG. 15 shows a data structure of a database stored in the storage unit 72. Aural characteristic information is added to the position database. For example, the acoustic pressure level of the minimum sound that can be heard by the ear (minimum audible value) is indicated in the aural characteristic information. Reference is made back to FIG. 4. In (5-2) above, the determination unit 74 changes the threshold value in accordance with the aural characteristic information of the user using the terminal device 10 expected to receive the speech. For example, it is ensured that the smaller the minimum audible value, the larger the threshold value, and, the larger the minimum audible value, the smaller the threshold value. The aural characteristic information for the terminal device 10 of the UID identified in (5-1) is used.

According to the embodiment, the process related to the reproduction of the speech signal in the terminal device expected to receive the speech is determined, based on the distances between the terminal devices expected to receive the speech, excluding the terminal device outputting the transmission request from the plurality of terminal devices belonging to the predetermined group. Therefore, the process adapted to the distance between the terminal devices expected to receive the speech is performed. Further, since the process adapted to the distance between the terminal devices expected to receive the speech is performed, the recipient terminal device that should receive the speech signal is selected. Further, since the recipient terminal device that should receive the speech signal is selected, situations where the speech is output from a plurality of terminal devices located in the neighborhood is inhibited from occurring. Further, since situations where the speech is output from a plurality of terminal devices located in the neighborhood is inhibited from occurring, the difficulty of hearing the group call is inhibited. Further, since the speech is reproduced from limited terminal devices, the speech is made easier to hear. Since the speech is not reproduced in terminal devices removed from the selection, electric power is saved.

Since the embodiment only requires comparing the distance between the terminal devices expected to receive the speech with the the threshold value, the process is simplified. By changing the threshold value in accordance with the reproduction volume of the speech signal set in the terminal device expected to receive the speech, the range of terminal devices that should be selected can be changed depending on the situation. By changing the threshold value in accordance with the method of reproducing the speech signal in the terminal device expected to receive the speech, the range of terminal devices that should be selected can be changed depending on the situation. By changing the threshold value in accordance with the environmental sound volume around the terminal device expected to receive the speech, the range of terminal devices that should be selected can be changed depending on the situation. By changing the threshold value in accordance with the aural characteristic information of the user using the terminal device expected to receive the speech, the range of terminal devices that should be selected can be changed depending on the situation. By determining the recipient terminal device in accordance with the battery level of the terminal device expected to receive the speech, avoidance of reproduction in the terminal device expected to receive the speech with a low battery level is facilitated. Since avoidance of reproduction in the terminal device expected to receive the speech with a low battery level is facilitated, the duration in which such a terminal device can be driven is extended.

Embodiment 2

A description will now be given of embodiment 2. Like embodiment 1, embodiment 1 relates to a communication system in which group calls are made in a group including a plurality of terminal devices. Embodiment 2 selects a recipient terminal device to which the speech signal should be transmitted, based on the distance between the terminal devices expected to receive the speech signal. In embodiment 2, the detail of the process that should be performed when the recipient terminal device receives the speech signal. The communication system 100 according to embodiment 2 is of a type similar to those of FIGS. 1, 7, and 10, the terminal device 10 is of a type similar to that of FIG. 2, and the call controller 20 is of a type similar to that of FIG. 4. The description here concerns a difference from embodiment 1.

The storage unit 72 of the call controller 20 of FIG. 4 stores a database similar to that of FIG. 12. The determination unit 74 determines the recipient terminal device 10 that should receive the speech signal in a process similar to that of embodiment 1 and then determines the detail of the process that should be performed when said recipient terminal device 10 receives the speech signal. Determining the detail of the process that should be performed when the recipient terminal device 10 receives the speech signal also represents determining a process related to the reproduction of the speech signal in the terminal device 10 expected to receive the speech. The detail of the process that should be performed when the recipient terminal device 10 receives the speech signal is exemplified by generation of an instruction to increase the sound volume when the sound volume is of a predetermined value or lower.

The determination unit 74 generates a specified transmission destination and process call 206. FIG. 16 shows a data structure of the specified transmission destination and process call 206 generated in the call controller 20. As in embodiment 1, the specified transmission destination and process call 206 is comprised of the transmission destination UID and speech information. Further, the specified transmission destination and process call 206 indicates a processing method in the terminal device 10. "Increase by 30" denotes an instruction to increase the volume of the speech output in the speech output unit 36 by "30". Reference is made back to FIG. 4. The output unit 76 outputs the specified transmission destination and process call 206 determined in the determination unit 74 to the communication unit 50, and the communication unit 50 transmits the specified transmission destination and process call 206 via the base station device. For example, the communication unit 50 broadcasts the specified transmission destination and process call 206.

When any one of the UIDs set in the transmission UIDs matches the UID stored in the storage unit 40, the controller 38 of the terminal device 10 of FIG. 2 receives an input of the speech information of the specified transmission destination and process call 206. Further, the controller 38 checks whether the processing method defined in the specified transmission destination and process call 206 and corresponding to the UID stored in the storage unit 40 indicates an increase or decrease of the sound volume. If an increase or a decrease is indicated, the controller 38 increases or decreases the sound volume in the speech output unit 36 accordingly. The speech output unit 36 reproduces a speech based on that speech information with the sound volume thus defined.

Figure 17:
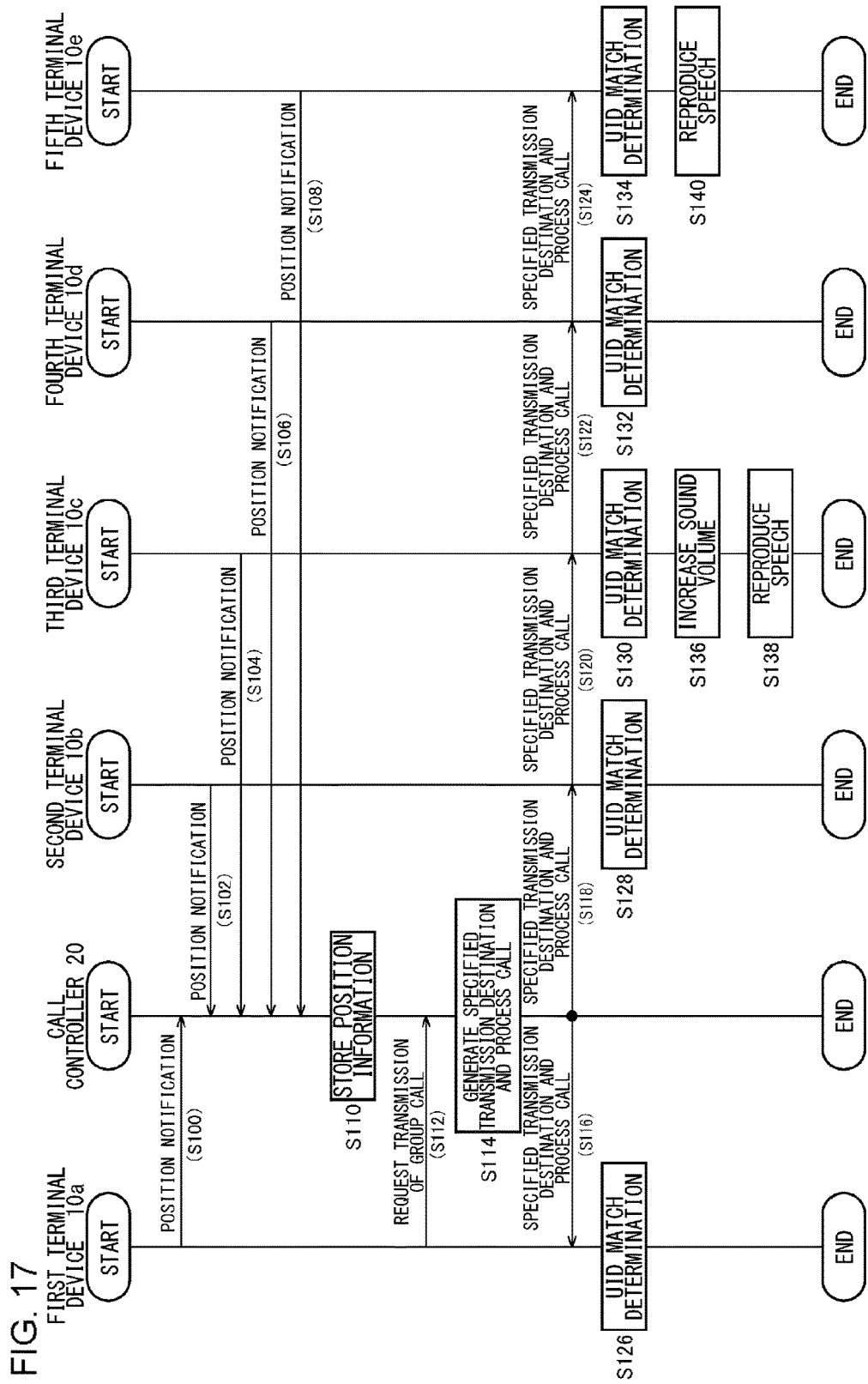
FIG. 17 is a sequence chart showing a communication procedure in the communication system according to embodiment 2.

A description will now be given of the operation of the communication system 100 with the above configuration. FIG. 17 is a sequence chart showing a communication procedure in the communication system 100. The first terminal device 10a through the fifth terminal device 10e transmit the position notification 200 to the call controller 20 (S100-S108). The call controller 20 stores the position information (S110). The first terminal device 10a transmits the group call transmission request 202 to the call controller 20 (S112). The call controller 20 generates the specified transmission destination and process call 206 (S114). The call controller 20 broadcasts the specified transmission destination and process call 206 to the first terminal device 10a through the fifth terminal device 10e (S116~S124). The first terminal device 10a through the fifth terminal device 10e perform a determination as to whether the UIDs match (S126~S134). The third terminal device 10c increases the sound volume (S136) and reproduces the speech (S138). The fifth terminal device 10e reproduces the speech (S140).

According to this embodiment, the detail of the process that should be performed when the recipient terminal device receives the speech signal is determined. Therefore, the recipient terminal device is caused to perform a process according to the detail of the process determined. Since the recipient terminal device is caused to perform a process according to the detail of the process determined, the terminal device that should reproduce the speech signal is selected in an ideal manner.

Embodiment 3

A description will now be given of embodiment 3. Like the foregoing embodiments, embodiment 3 relates to a communication system in which group calls are made in a group including a plurality of terminal devices. A selection is made of a recipient terminal device that should receive the speech signal. In the foregoing embodiments, the selection is made based on the distance between the terminal devices expected to receive the speech. Meanwhile, in embodiment 3, the selection is made based on a distance between the terminal device expected to receive and output the speech and the user using the terminal different from that outputting terminal device. The communication system 100 according to embodiment 3 is of a type similar to those of FIGS. 1, 7, and 10, the terminal device 10 is of a type similar to that of FIG. 2, and the call controller 20 is of a type similar to that of FIG. 4. The description here concerns a difference from the foregoing embodiments.

The user using the terminal device 10 included in the communication system 100 carries a device capable of measuring position information of the user. The position information measured by the device is transmitted to the call controller 20. The storage unit 72 of the call controller 20 of FIG. 4 stores the position information of the users in the position database. The determination unit 74 uses, in (5-2), the position information corresponding to the UID determined in (5-1) described above such that the position information of the user carrying the terminal device corresponding to the UID is used instead of the position information of the terminal device 10 corresponding to the UID. The other steps in the process are the same as the steps already described so that a description thereof is omitted. In essence, the determination unit 74 determines a process related to the reproduction of the speech signal in the terminal device 10 expected to receive the speech, based on the distance between the terminal device 10 expected to receive the speech, excluding the terminal device 10 outputting the transmission request from the plurality of terminal devices 10 belonging to a given group, and the users using the terminal devices 10 expected to receive the speech.

In accordance with the embodiment, the process related to the reproduction of the speech signal in the terminal device expected to receive the speech is determined based on the distance between the terminal device expected to receive the speech and the user using the other terminal devices. Accordingly, the actual easiness for the user to hear can be reflected.

Described above is an explanation based on an exemplary embodiment. The embodiment is intended to be illustrative only and it will be understood by those skilled in the art that various modifications to constituting elements and processes could be developed and that such modifications are also within the scope of the present invention.

In embodiments 1 through 3, the communication system 100 uses the business wireless system. However, the communication system 100 is non-limiting as to the system it uses, and wireless communication systems other than the business wireless system may be used. According to this embodiment, the flexibility of the configuration is improved.

In embodiments 1 through 3, the determination device 60 is included in the call controller 20. The location of the determination device 60 is non-limiting, and the determination device 60 may be included in the terminal device 10. In this case, the plurality of terminal devices 10 collect position information mutually, and generate and transmit the specified transmission destination call 204 or the specified transmission destination and process call 206. Further, the call controller 20 is not necessary. According to this embodiment, the flexibility of the configuration is improved.

What is claimed is:

1. A determination device including software loaded into a memory and implemented by a processor, the determination device comprising:
    an input unit that receives a request for transmission of a speech signal to a predetermined group; and
    a determination unit that determines a process related to reproduction of the speech signal in a terminal device expected to receive a speech, based on a distance between terminal devices expected to receive the speech signal, excluding the terminal device outputting the request from a plurality of terminal devices belonging to the predetermined group,
    wherein the determination unit determines a process related to reproduction of the speech signal in the terminal device expected to receive the speech, by determining a recipient terminal device that should receive the speech signal to reproduce the speech signal,
    wherein the determination unit determines the recipient terminal device that should receive the speech signal, based on a result of comparing the distance between the terminal devices expected to receive the speech signal and a threshold value, and
    wherein the determination unit changes the threshold value in accordance with a method of reproducing the speech signal in the terminal device expected to receive the speech.

2. The determination device according to claim 1, wherein the determination unit changes the threshold value in accordance with an environmental sound volume around the terminal device expected to receive the speech.

3. A determination device including software loaded into a memory and implemented by a processor, the determination device comprising:
    an input unit that receives a request for transmission of a speech signal to a predetermined group; and
    a determination unit that determines a process related to reproduction of the speech signal in a terminal device expected to receive a speech, based on a distance between terminal devices expected to receive the speech signal, excluding the terminal device outputting the request from a plurality of terminal devices belonging to the predetermined group, wherein the determination unit determines a process related to reproduction of the speech signal in the terminal device expected to receive the speech, by determining a recipient terminal device that should receive the speech signal to reproduce the speech signal, wherein the determination unit determines the recipient terminal device that should receive the speech signal, based on a result of comparing the distance between the terminal devices expected to receive the speech signal and a threshold value, and wherein the determination unit changes the threshold value in accordance with aural characteristic information on a user using the terminal device expected to receive the speech.

4. The determination device according to claim 1, wherein the determination unit determines the recipient terminal device in accordance with a battery level of the terminal device expected to receive the speech.

5. The determination device according to claim 1, wherein determination, by the determination unit, of a process related to reproduction of the speech signal in the terminal device expected to receive the speech includes determining a detail of a process that should be performed when a recipient terminal device receives the speech signal.

6. A computer implemented method of software loaded into a memory, the method comprising:

receiving, by an input unit, a request for transmission of a speech signal to a predetermined group;

determining, by a determination unit, a process related to reproduction of the speech signal in a terminal device expected to receive a speech, based on a distance between terminal devices expected to receive the speech signal, excluding the terminal device outputting the request from a plurality of terminal devices belonging to the predetermined group;

determining, by the determination unit, a process related to reproduction of the speech signal in the terminal device expected to receive the speech, by determining a recipient terminal device that should receive the speech signal to reproduce the speech signal;

determining, by the determination unit, the recipient terminal device that should receive the speech signal, based on a result of comparing the distance between the terminal devices expected to receive the speech signal and a threshold value; and changing, by the determination unit, the threshold value in accordance with aural characteristic information on a user using the terminal device expected to receive the speech.

* * * * *